(12) United States Patent
Graham et al.

(10) Patent No.: US 8,598,767 B2
(45) Date of Patent: Dec. 3, 2013

(54) PIEZOELECTRIC ACTUATOR

(75) Inventors: Karl W Graham, Ballymena (GB); Sami V. Horkko, Chatham (GB); Philip J Butler, Sittingbourne (GB); Manfred Kolkman, Messancy (BE)

(73) Assignee: Delphi Technologies Holding S.arl, Luxembourg (LU)

( * ) Notice: Subject to any disclaimer, the term of this patent is extended or adjusted under 35 U.S.C. 154(b) by 1155 days.

(21) Appl. No.: 12/085,242

(22) PCT Filed: Jan. 16, 2007

(86) PCT No.: PCT/GB2007/000108
§ 371 (c)(1),
(2), (4) Date: Aug. 5, 2009

(87) PCT Pub. No.: WO2007/085795
PCT Pub. Date: Aug. 2, 2007

(65) Prior Publication Data
US 2009/0301440 A1 Dec. 10, 2009

(30) Foreign Application Priority Data
Jan. 30, 2006 (EP) .................................... 06250491

(51) Int. Cl.
H01L 41/08 (2006.01)
(52) U.S. Cl.
USPC .......................................... 310/338; 310/328

(58) Field of Classification Search
USPC .......................................................... 310/328
See application file for complete search history.

(56) References Cited

U.S. PATENT DOCUMENTS

| 5,004,438 A | 4/1991 | Cabourne |
| 7,804,230 B2 | 9/2010 | Redding et al. |

FOREIGN PATENT DOCUMENTS

| EP | 0 999 901 | 4/2000 |
| EP | 1 574 702 | 9/2005 |
| EP | 1 596 058 | 11/2005 |
| JP | 2006-233853 | 9/2006 |
| JP | 2006-233959 | 9/2006 |
| JP | 2006-283756 | 10/2006 |

Primary Examiner — Mark Budd
(74) Attorney, Agent, or Firm — Mark H. Svoboda

(57) ABSTRACT

A piezoelectric actuator arrangement (30) for use in a fuel injector (2), the actuator arrangement (30) comprising a stack (36) of one or more piezoelectric elements for receipt with an fluid chamber (12) of the injector (2), electrode means for generating an electric field within the stack (36), in use, and an electrical connector arrangement (42) for electrically connecting the electrode means to an external power supply, in use. The connector arrangement (42) comprises a first portion (60) in the form of a, base member, and a second portion (62) in the form of a body member, that are mutually arranged to form an articulated joint so as to provide the first portion (60) with at least one degree of freedom relative" to the second portion (62).

12 Claims, 8 Drawing Sheets

PIEZOELECTRIC ACTUATOR

TECHNICAL FIELD

The present invention relates to a piezoelectric actuator and, particularly, to an electrical connector arrangement for a piezoelectric actuator of the type suitable for use in a fuel injector of an internal combustion engine.

BACKGROUND TO THE INVENTION

Automotive fuel injectors for delivering fuel into a combustion space of an internal combustion engine typically comprise a control piston which is operable to control the pressure of fuel contained within an injector control chamber. The control chamber is defined, in part, by a surface associated with an injector valve needle such that changes of fuel pressure within the control chamber cause the valve needle to move into and out of engagement with an associated seating surface. As a result, delivery of pressurised fuel into the combustion space of the engine is controlled.

It is known to provide a fuel injector with a piezoelectric actuator to control movement of the control piston. Piezoelectric actuators used for this purpose are generally in the form of a stack body having a multi-layered laminated stack of piezoceramic elements or layers, each of which is separated by an electrically conductive layer. The electrically conductive layers act as internal electrodes. The stack body is provided with positive and negative distribution electrodes arranged to establish electrical contact with the internal electrode layers. The distribution electrodes themselves are connectable to a power source, thus conveying a voltage to the internal electrode layers.

Application of a voltage across the internal electrode layers causes the stack to expand or contract in dependence on the polarity of the applied voltage. Accordingly, the magnitude of the expansion and contraction corresponds to the magnitude of the applied voltage. The change in length of the stack is used to control movement of the control piston, thus controlling opening and closing of the valve needle.

It is known that the application of a compressive force to a piezoelectric stack influences beneficially its performance and durability. In the case of piezoelectrically operable fuel injectors for use in compression-ignition internal combustion engines, a known approach is to locate the piezoelectric stack within a fuel-filled fluid volume or chamber. Typically, fuel within the fluid chamber is maintained at pressures of up to 2000 bar and so the piezoelectric stack experiences a high compressive loading due to hydrostatic forces. An actuator of this type is exemplified in EP0995901. Enveloping the stack within a polymer casing or sleeve guards against ingress of high pressure fuel into the stack structure.

Although locating the piezoelectric actuator in a high pressure fluid environment has advantages, it is necessary to ensure that the electrical connections to the stack are adequately and reliably sealed from high pressure fuel within the fluid chamber. Also, it is vital to ensure that the high hydrostatic forces and the aggressive effects of the fuel-laden environment do not adversely affect the provisions for insulating the stack.

It is an object of the present invention to provide an improved electrical connector arrangement for such a piezoelectric actuator which addresses these issues.

DISCLOSURE OF THE INVENTION

In a first aspect of the invention, the invention resides in a piezoelectric actuator arrangement for use in a fuel injector, the actuator arrangement comprising a stack of one or more piezoelectric elements for receipt within a fluid chamber of the injector, electrode means for generating an electric field within the stack, in use, and an electrical connector arrangement for electrically connecting the electrode means to an external power supply, in use. The connector arrangement comprises a first portion, in the form of a base member, and a second portion in the form of a body member, that are arranged to form an articulated joint so as to provide the first portion with at least one degree of freedom relative to the second portion. Although not essential to the invention, it is preferred that the first portion and the second portion are aligned along a common axis.

The degree of freedom permitted between the base and body members of the connector arrangement allows the base member, and therefore also the piezoelectric stack, to tilt relative to the body member away from the common axis of the connector arrangement. Whilst the base member is permitted a degree of movement, the body member remains fixed relative to the injector body within which it is installed, in use. In circumstances where the stack is axially misaligned with the injector body following installation, the stack is able to move to compensate for such misalignments which could otherwise adversely affect the high pressure sealing function of the connector arrangement. The actuator arrangement therefore provides a more consistent and controlled hydraulic seal against fuel leakage from the fluid chamber.

In the preferred embodiment, the base member includes an upper face that defines a first, convex or domed surface that curves outwardly toward the body member. Correspondingly, it is preferred that the body member includes a lower face defining a concave surface that is co-operable with the domed upper face of the base member. The mutually shaped engaging surfaces of the base member and the body member may then slide relative to one another so as to achieve the 'tilting'.

Although the base member and the body member may be constructed from various materials, for example plastics or metals, they are preferably manufactured from a ceramic material, for example aluminium oxide. Ceramics are preferred primarily for their high electrical resistivity and their high resilience to the high pressure environment in which the connector arrangement is to operate, but also because of their comparatively low coefficient of friction which aids relative movement between the base and body members. To further reduce the friction between the base and body members, either or both of the adjoining faces may be coated with a friction-reducing agent, for example polytetrafluoroethylene ('PTFE').

In order to connect the distribution electrode means of the stack to a power source, the connector arrangement may include terminal means comprising at least one conductor rod received by a respective bore extending along an axis through both the base member and the body member. The preferred embodiment of the invention features a particularly elegant arrangement in which the bores are disposed inward of an external boundary of the connector arrangement. To complete the connection of the electrode means to the power source, it is preferred that one end of the or each conductor rod is connected to the power source by way of a terminal blade and that the other end of the or each connector rod is connected to an electrical contact plate which, in turn, contacts the electrode means.

The invention is particularly suitable for use with a stack having electrode means including first and second distribution electrodes arranged one on each opposed side face of the stack, each contact plate including a radially outer face for contacting an inner surface of a respective distribution electrode. The connector arrangement of the invention is also suitable for use with a stack having electrodes disposed inward of the external stack boundary, as exemplified in the applicant's co-pending European patent application no. EP 04255835.3.

In addition to the central concept of an actuator having an articulated connector arrangement, the actuator arrangement preferably also performs the function of sealing the fluid chamber, in use, against the escape of high pressure fuel. To this end, the connector arrangement may include a sealing surface for abutment with an internal surface defined by the fluid chamber. Preferably, the sealing surface is defined by a shoulder region provided on the body member and forms a knife-edge seal with the internal surface of the chamber. Such a sealing arrangement is particularly suited to a high pressure environment since the sealing effect becomes more effective the greater the axial load exerted on the seat. However, it will be appreciated that other arrangements are possible within the ambit of the invention, for example a flat sealing surface.

It is also a preferred feature that a stem region of the actuator arrangement is received within a channel portion of the fluid chamber, wherein a sleeve member receives the stem region and defines a press fit with the channel so as to secure the actuator arrangement into position within the fluid chamber. For reasons of strength, it is preferred that the sleeve member is formed of steel or a steel alloy.

In a second aspect, the invention relates to a fuel injector comprising a fluid chamber housing a piezoelectric actuator arrangement as described above. In order to provide a back-up feature in the event of fuel leaking past the various seals established by the actuator arrangement, it is preferred that the injector is provided with a drainage bore which opens into a channel for receiving the stem region of the actuator arrangement. The drainage bore therefore provides a means for leaked fuel to flow back to low pressure.

The invention also provides, in a third aspect, a connector arrangement for use with a piezoelectric actuator as described above, the connector arrangement comprising a first portion and a second portion arranged to form an articulated joint so as to provide the first portion with at least one degree of freedom relative to the second portion.

It should be appreciated that preferred and/or optional features of the first aspect of the invention may be combined with the second and third aspects, as appropriate.

BRIEF DESCRIPTION OF THE DRAWINGS

The present invention will now be described, by way of example only, with reference to the accompanying drawings in which.

DETAILED DESCRIPTION OF THE PREFERRED EMBODIMENTS

Figure 1:
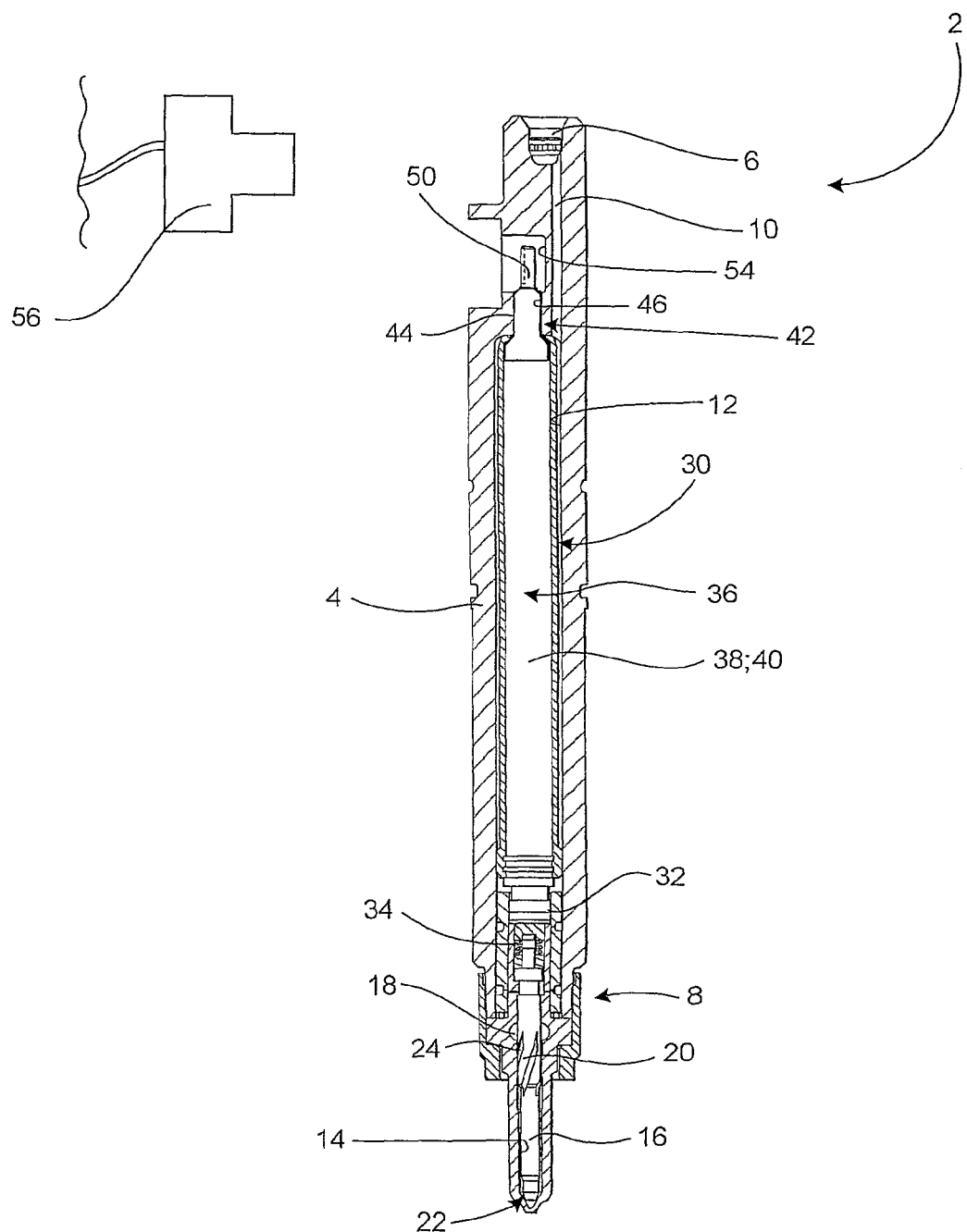
FIG. 1 is a sectional view of a fuel injector incorporating a piezoelectric actuator arrangement according to one aspect of the invention.

FIG. 1 shows a fuel injector, indicated generally as 2, suitable for use in an internal combustion engine, particularly a compression-ignition internal combustion engine, or 'diesel engine'. The fuel injector 2 includes an injector body 4 having a first, upper end defining an inlet 6 for connection to a fuel source, and a second, lower end to which an injector nozzle body 8 is connected. It should be appreciated that the terms 'upper' and 'lower' are referred to in the context of the drawings and are not intended to limit any of the components thereby described to a specific orientation. Between its upper and lower ends, the injector body 4 defines passageways for fuel including an inlet passage 10 that extends away from the injector inlet 6 and leads to a fluid chamber 12. Although not shown clearly in FIG. 1, the fluid chamber 12 is arranged to be in fluid communication with an axial bore 14 provided in the nozzle body 8, within which a valve needle 16 is slidable.

Pressurised fuel is supplied to the injector body 4 via the inlet 6 from a common rail or other suitable source of pressurised fuel. Although it is not shown in FIG. 1, such a source of pressurised fuel may also be arranged to supply fuel to one or more other injectors of the engine in a known manner. Pressurised fuel is conveyed from the inlet 6, through the inlet passage 10 and the fluid chamber 12, in turn, to an annular chamber 18 defined by the axial bore 14 of the nozzle body 8.

The annular chamber 18 surrounds the outer periphery of an upper portion 20 of the valve needle 16 and constitutes a delivery chamber from which fuel is directed to flow in the direction of a nozzle tip 22 along fuel channels 24 provided in the valve needle 16. As the valve needle 16 moves out of engagement of the nozzle tip 22, pressurised fuel is delivered into an associated combustion chamber of the engine through one or more nozzle outlets (not shown in FIG. 1).

The fluid chamber 12 houses a piezoelectric actuator, referred to generally as 30, for effecting linear movement of the valve needle 16. Linear expansion and contraction of the actuator 30 is transmitted to the valve needle 16 by a control piston 32 which is attached, or otherwise coupled, to a first, lowermost end of the actuator 30. The control piston 32 serves to control the volume, and therefore the pressure, of fuel within a control chamber 34 located at the back end of the valve needle 16. By controlling the pressure of fuel within the control chamber 34, the position of the control piston 32 controls whether or not fuel injection occurs through the outlets.

Figure 2:
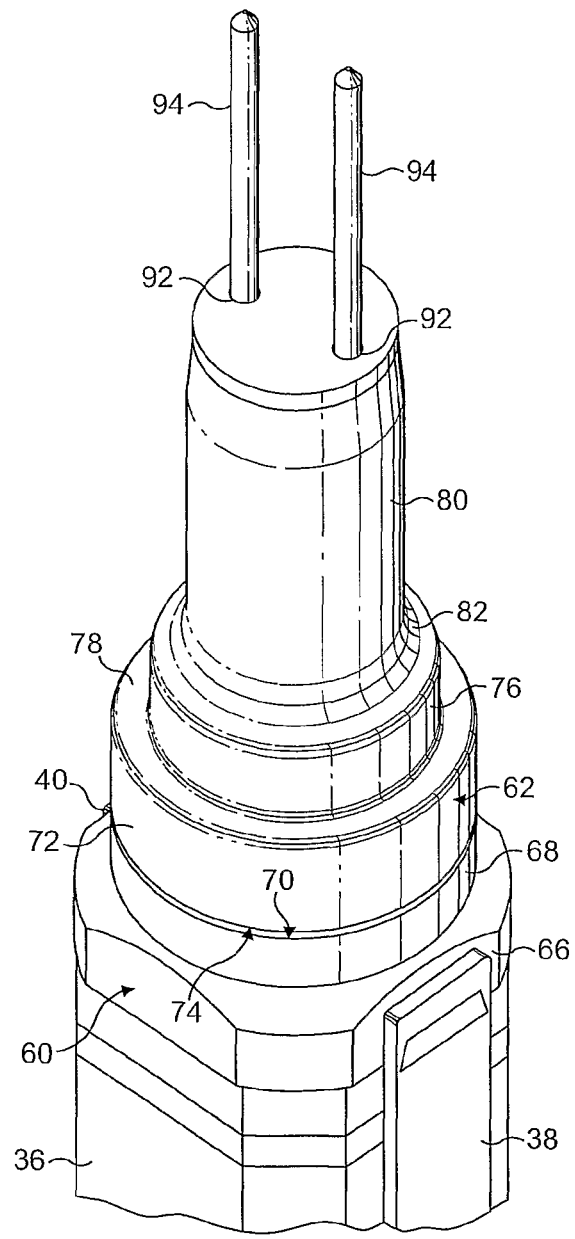
FIG. 2 is an enlarged perspective view, from above, of the piezoelectric actuator arrangement of FIG. 1.

Referring also to FIG. 2, the actuator 30 comprises a generally octagonal sectioned stack 36 of piezoelectric elements having electrode means for generating an electric field within the stack 36. The electrode means includes a plurality of internal electrode layers (not shown in FIG. 1), each of which separate adjacent piezoelectric elements of the stack 36. The electrode means also includes positive and negative distribution electrodes 38, 40 that run longitudinally along opposing side faces of the stack 36 and make electrical contact with the internal electrodes within the stack 36: only one such electrode can be seen on FIG. 1 but both are shown in FIG. 2. The positive and negative distribution electrodes 38, 40 are connected to an electrical connector arrangement 42 and serve to convey an actuation voltage to the internal electrodes from an external power supply (not shown), by which means the stack 36 is cause to expand and contract.

The electrical connector arrangement 42 includes a connector module 44 located at an upper end, or ceiling, of the fluid chamber 12 and extending through a longitudinal drilling or channel 46 provided in the injector body 4. Although FIG. 1 does not show the connector module 44 in detail, it can be seen that it includes electrical terminal means in the form of positive and negative terminal blades 50 (only one of which is shown in FIG. 1). The terminal blades 50 project away from the connector module 44 and include free ends that reside in a plug recess 54 provided in the injector body 4. The terminal blades 50 provide an electrical connection point for an external power supply plug 56 and serve to convey an actuation voltage to the distribution electrodes 38, 40, and thus to the internal electrodes, via the connector module 44.

The connector module 44 will now be described in greater detail with reference to FIG. 2 and also FIG. 3. The connector module 44 comprises a main body structure including a first, block-like lower portion 60 (hereafter referred to as the base member) and a second, upper portion 62 of stepped cylindrical form (hereafter referred to as the body member) which sits upon the base member 60. The base member 60 and the body member 62 are aligned along a common axis A (identified in FIG. 3).

The base member 60 is attached, by using an epoxy resin such as ECCOBOND® for example, to an upper face 64 of the stack 36 and includes a lower region 66 which is substantially octagonal in cross section so as to match the octagonal lateral cross section of the stack 36.

The lower region 66 of the base member 60 tapers upwardly into a relatively short cylindrical region 68 of reduced diameter, an upper face 70 of which defines a surface on which the body member 62 sits. The body member 62 includes a first, lower region 72 which is substantially the same diameter as the cylindrical region 68 of the base member 60. The lower region 72 has a lower face 74 that lies adjacent to, and thus mates with, the upper face 70 of the base member 60.

The body member 62 also includes a second, intermediate cylindrical region 76 having a smaller diameter than that of the first region 72 such that a first shoulder region 78 is defined at their transition. The intermediate region 76 tapers into a third, upper stem region 80 which has a smaller diameter than the intermediate region 76. The transition from the intermediate region 76 to the stem region 80 defines a second shoulder region 82 which constitutes a connector module sealing face. The connector module sealing face engages with an internal surface of the fluid chamber 12, thus preventing high pressure fuel from escaping from the chamber 12, in use, as will be described in more detail later.

The connector module 44 is provided with first and second bores 92 that extend through the base member 60 and the body member 62 along respective axes that are parallel to the common axis A of the connector module 42 and spaced apart from each other in a side by side manner. Each bore 92 receives a respective conductor member 94 in the form of a rod. Each conductor rod 94 has a first, lower end that protrudes at the lower face of the base member 60 to engage with respective metallic contact plates 96 located in generally rectangular recesses 98 provided on the underside of the base member 60. Upper ends of the conductor rods 94 extend upwardly from the stem region 80 to provide a sufficient length for connection to the terminal blades 50 (not shown in FIGS. 2 and 3) of the module 44. The means by which the conductor rods 94 are connected to the terminal blades 50 is not within the scope of the invention and so will not be described in further detail here.

Figure 3:
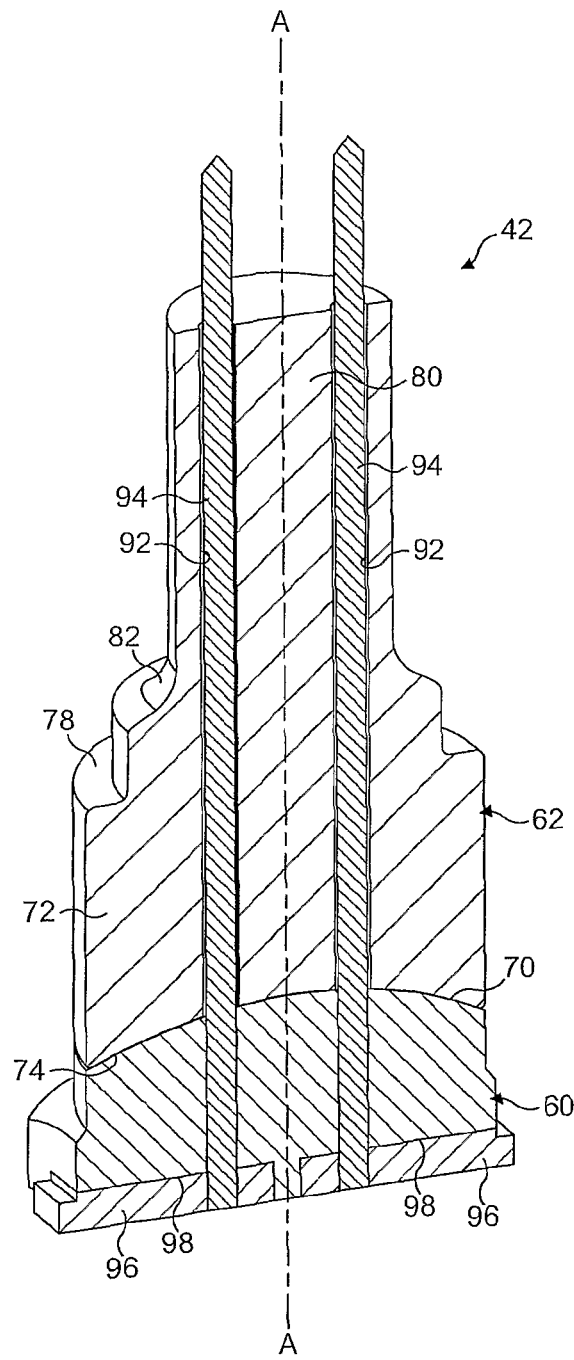
FIG. 3 is a sectional view, in perspective, of a connector module of the actuator arrangement in FIG. 2.

As shown most clearly in FIG. 3, the upper face 70 of the base member 60 is shaped to define a convex, or domed, surface which abuts the lower face 74 of the body member 62. The lower face 74 of the body member 62 is correspondingly shaped to define a concave surface. Together, the convex upper face 70 of the base member 60 and the concave lower face 74 of the body member 62 form an articulated 'ball and socket' joint by which means the base member 60, and thus the stack 36 to which it is connected, is provided at least one degree of freedom relative the body member 62. The stack 36 is therefore permitted to tilt angularly away from the common axis A so as to compensate for any manufacturing inaccuracies which may otherwise cause misalignment between the stack 36 and the injector body 4. In effect, therefore, the base member 60 can rotate around an axis that is perpendicular to the common axis A of the actuator arrangement 42. This is a significant advantage since, without any means for compensating for misalignment, the lateral force exerted on the stack 36 may prevent reliable sealing of the fluid chamber 12. Furthermore, since piezoelectric stacks are strong in compression, but relatively weak in tension or when subject to shearing forces, the reduction in the lateral force on the stack 36 benefits the durability of the stack 36.

Optionally, to reduce the friction between the upper surface 70 and the lower surface 74, one or both of said surfaces may be provided with a friction reducing coating, for example polytetrafluoroethylene (PTFE) or a diamond-like carbon (DLC).

Figure 4:
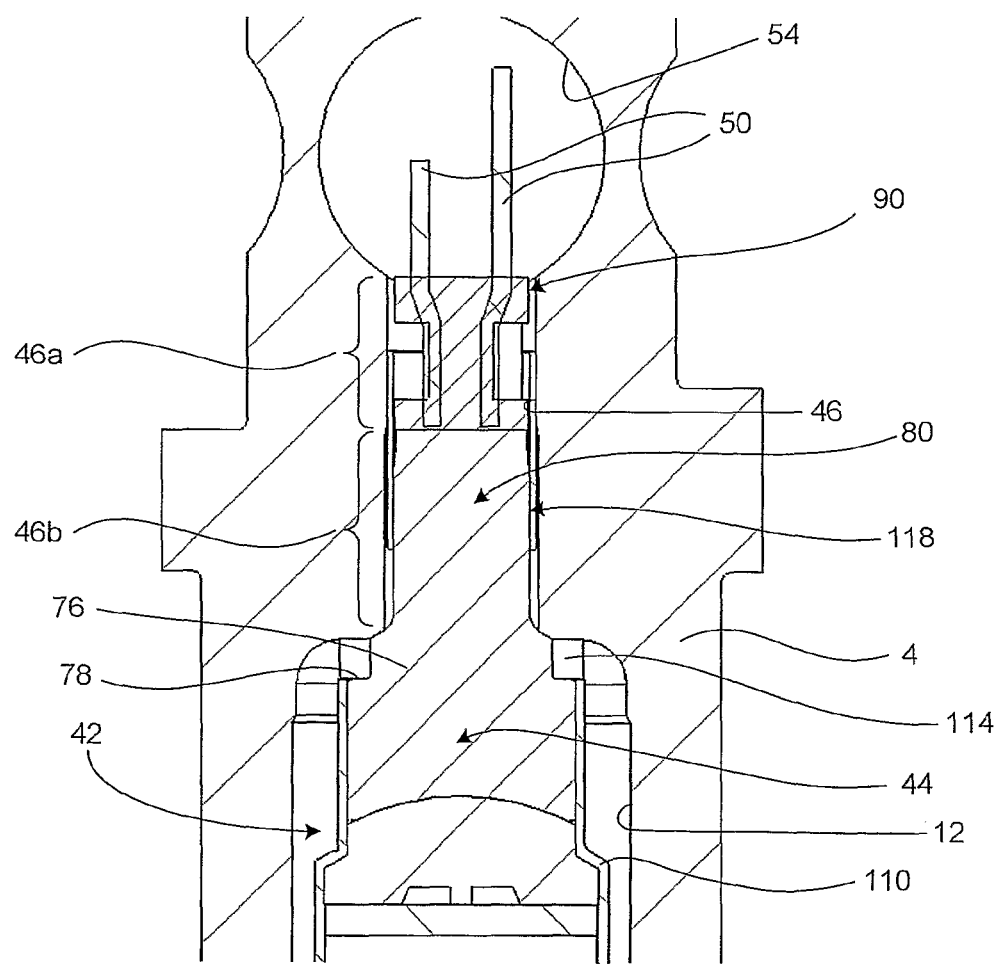
FIG. 4 is a sectional view of the actuator arrangement in FIGS. 2 and 3 installed within a fluid chamber of an injector body.

In FIG. 4, the fully assembled actuator arrangement 30 is shown installed in the fluid chamber 12 of the injector body 4. The upper end of the connector arrangement 42, that is to say the terminal blades 50 and the stem region 80, are inserted into the longitudinal channel 46 of the injector body 4 such that the terminal blades 50 protrude into the plug recess 54. In FIG. 4, the terminal blades 50 are shown embedded within a terminal cap 90 which provides a means for connecting the conductor rods 94 to an external power source.

A protective sleeve 118 is received over the stem region 80 of the body member 62 and serves the primary function of aligning the stem region 80 correctly in the channel 46 of the injector body. The protective sleeve 118 defines a press fit with the channel 46, thus securing the connector module 44 into place within the injector body 4. The longitudinal channel 46 includes an upper region 46a having a diameter substantially the same as the protective sleeve 118, thus defining a press fit therewith, and a slightly wider lower region 46b. The lower region 46b assists the procedure of positioning the connector arrangement 42 within the channel 46 during manufacture, prior to the final step of pushing the connector arrangement 42 into the position shown in FIG. 4.

In order to protect the assembled connector arrangement 42 and the stack 36 from the aggressive chemical environment in which they are required to operate, a protective polymer sleeve 110 enshrouds the stack 36 and extends up onto the cylindrical portion 72 of the body member 62 so as to terminate in line with the first shoulder 78. The polymer sleeve 110 is impervious to high pressure fuel and thus protects the relatively fragile ceramic material of the stack 36 from damage. In this embodiment, the polymer sleeve 110 shrinks to fit the stack 36 and connector module assembly when heat is applied to it during a specific manufacturing step. It should be appreciated that although a heat shrinkable sleeve is the currently preferred method of protectively encapsulating the stack 36, other means are possible. For example, the stack 36 may be encapsulated by means of an elastically expanded tube, or a sprayed, dipped or painted coating.

The actuator arrangement 30 is also provided with a polymer sealing ring 114 which is received onto the intermediate region 76 of the body member 62 such that an underside surface of the ring 114 sits on the first shoulder region 78. The depth of the sealing ring 114 is such that an upper surface 116 thereof is in approximate axial alignment with the second shoulder region 82 of the body member 62.

Figure 5:
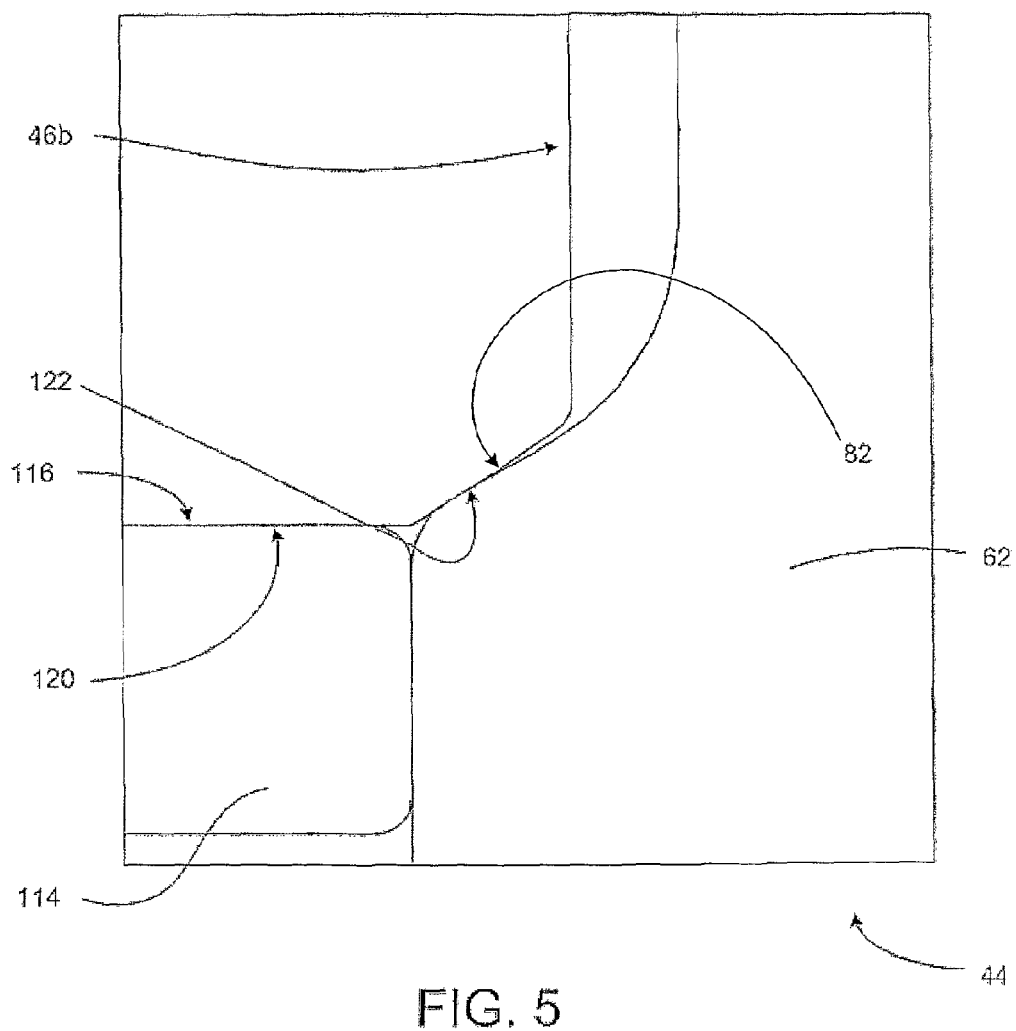
FIG. 5 is an enlarged sectional view of a portion of FIG. 4 illustrating the region in which the connector arrangement engages a sealing surface provided by the injector body.

The embodiment shown in FIG. 4 provides three seals to prevent leakage of fuel from the fluid chamber 12 through the channel 46. A first seal is provided by the sealing ring 114, which is shown in more detail in FIG. 5. The flat upper face 116 of the sealing ring 114 abuts a flat peripheral surface 120 formed by a step at the opening of the channel 46. During use, the fluid chamber 12 is filled with high pressure fuel which applies an upward axial force to the stack 36 (the stack is not shown in FIG. 5). The force is transmitted through the connector module 44 and compresses the sealing ring 114 between the shoulder 78 and the surface 120. The increased axial force improves the effectiveness of the first seal against high pressure fuel.

A second seal is defined by the second shoulder region 82 of the body member 62 engaging a frustoconical inner surface 122 provided at the opening of the channel 46. The second shoulder region 82 is also frustoconical but has a larger cone angle than that of the surface 122 such that the surface 122 and the shoulder region 82 meet towards the periphery of the shoulder to define a 'knife edge seal'.

The effectiveness and reliability of the seals at 114 and 122 is benefited by the articulation permitted between the base member 60 and the body member 62: the base member 62 is able to tilt in order to accommodate misalignment of the stack 36 in the injector body 4 whilst the body member 62 remains in a fixed position relative to the channel 46.

A third seal is provided by the close fit that the protective sleeve 118 makes with the internal wall of the channel 46. In addition, the fit between the protective sleeve 118 and the channel 46 provides a means to load the base member 60 against the sealing ring 114 in circumstances where the fluid chamber 12 is at low pressure.

Figure 6:
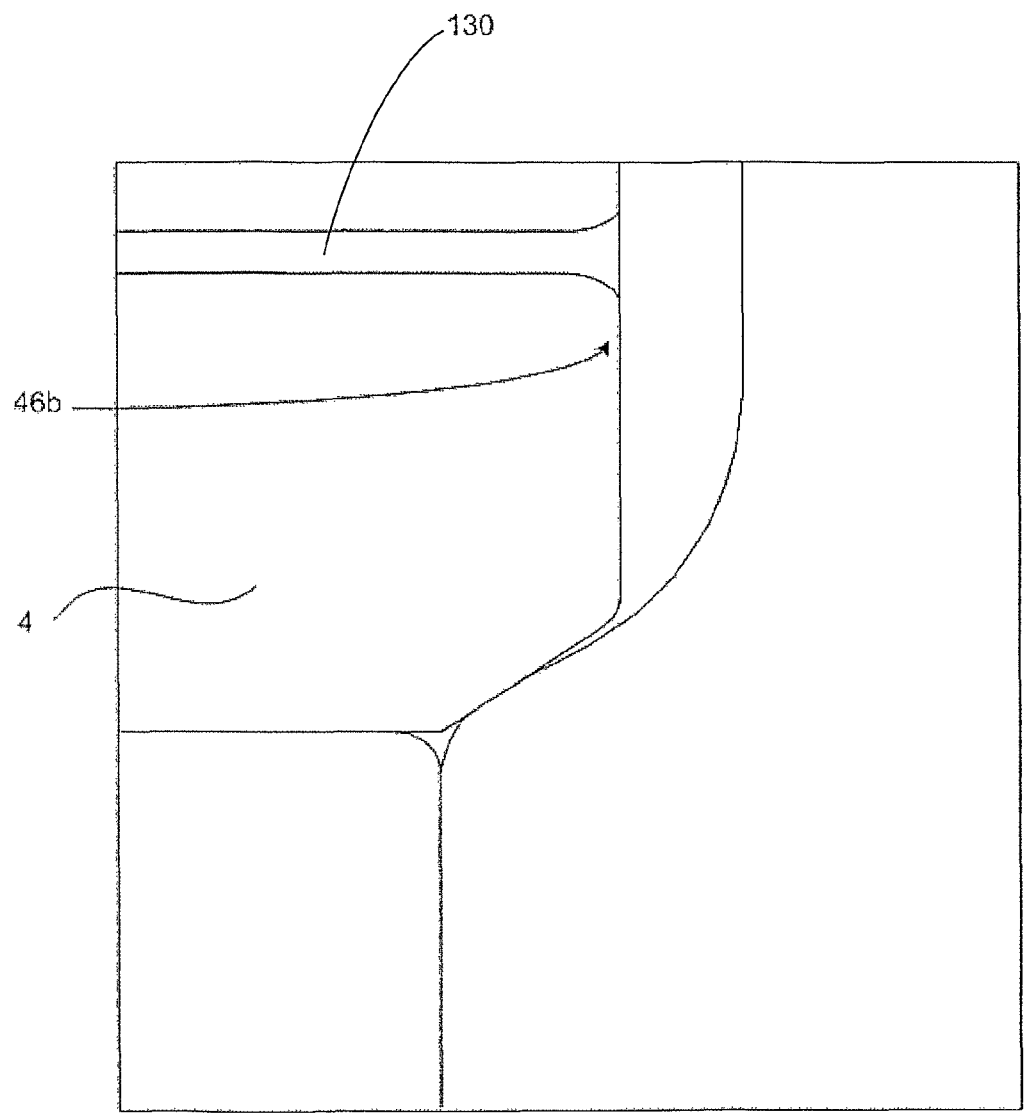
FIG. 6 is a sectional view of an alternative embodiment of the invention.

In an alternative embodiment, as shown in FIG. 6, the injector body 4 is provided with a lateral drainage bore 130 having an radially inner end opening into the enlarged region 46b of the channel 46 and a radially outer end that communicates with a low pressure leakage path (not shown). In circumstances where fuel does manage to leak past the first and second hydraulic seals 114, 122, the drainage bore 130 provides a fuel drain path such that fuel is prevented from leaking into the power plug recess 54 (the plug recess is not shown in FIG. 6).

Figure 7:
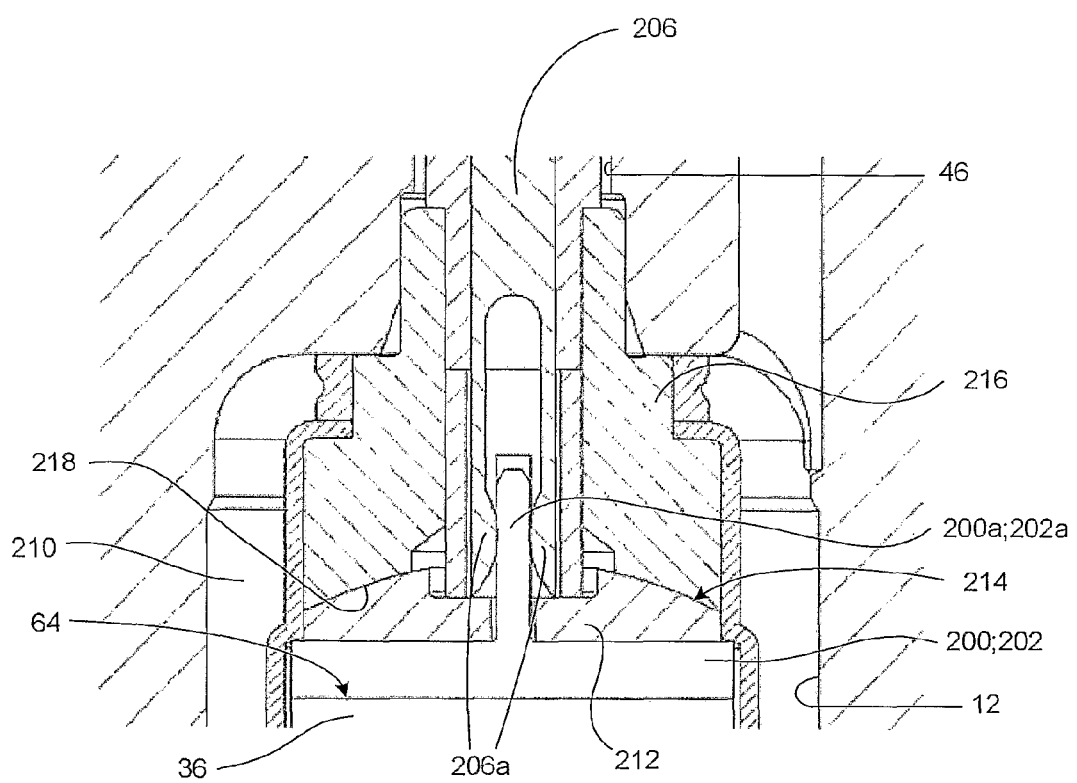
FIGS. 7 and 8 are sectional views of a further alternative embodiment of the invention.
Figure 8:
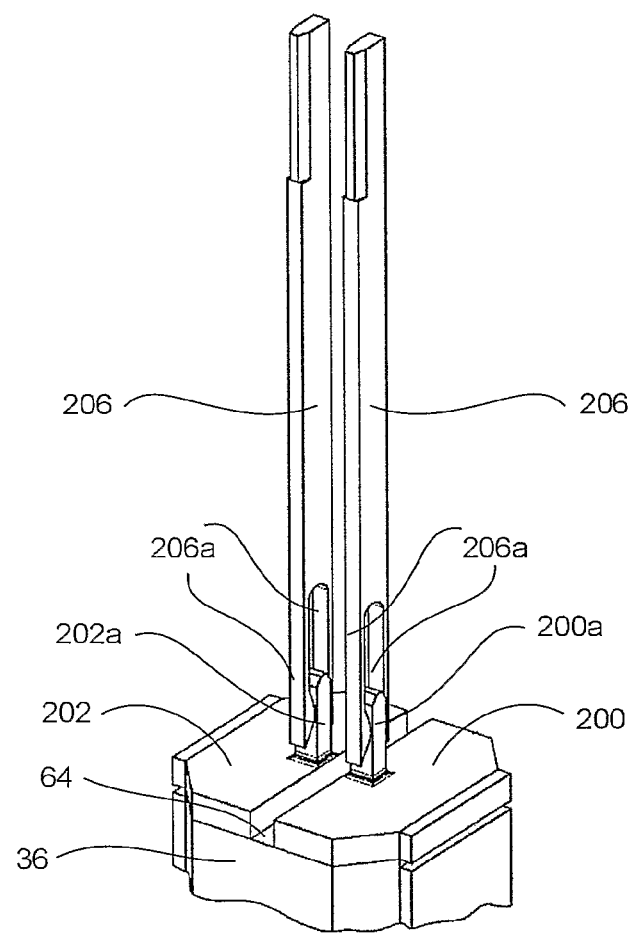

A further alternative embodiment is shown in FIGS. 7 and 8, in which like parts are denoted by like reference numerals, where appropriate. In this embodiment, positive and negative contact plates 200, 202 are mounted directly on the upper face 64 of the stack 36. The contact plates 200, 202 are arranged on the left and right of the stack 36 as shown and their edges lie flush with the top edges of the stack 36. An air gap is provided between the contact plates 200, 202 so as to electrically insulate one from the other. Each contact plate 200, 202 includes an upwardly extending leg 200a, 202a disposed in line with one another in a side-by-side relationship.

As in the previous embodiments, first and second terminal blades 206 are provided to connect the contact plates 200, 202 to an external power source (not shown). However, in this embodiment the terminal blades 206 attach to the contact plates 200, 202 directly by way of forked lower ends defining two downwardly depending prongs 206a which receive and grip the upwardly extending legs 200a, 202a of a respective contact plate 200, 202. Since the prongs 206a grip the legs 200a, 202a securely by way of an interference fit, the manufacturing process is simplified since there is no requirement to weld these components together.

As is shown in FIG. 7, a ball and socket arrangement 210 fits around the contact plates 200, 202 and the terminal blades 206 to guide tilting movement of the blades 206 relative to the stack 36. In a similar manner to the embodiment of FIGS. 2 to 6, the ball and socket arrangement 210 includes a base member 212 which sits across the contact plates 200, 202 and has an upper face 214 defining a convex surface. A stepped body member 216 includes a lower face 218 that is correspondingly shaped to define a concave surface for mating with the convex surface 214 of the base member 212. An upper end of the base member 212 is suitably shaped for insertion into the channel 46 of the fluid chamber 12.

It should be appreciated that various improvements and modifications may be made to the embodiments described herein without departing from the scope of the invention as defined by the claims. For example, although the embodiments described above include two terminal blades, this is the preferred configuration only, and the invention is equally applicable to a connector arrangement having a single terminal or, alternatively, more than two terminals. Further, although the actuator of the invention is particularly suitable for installation within a fuel-filled chamber when incorporated within an injector, this need not be the case and instead the actuator may be installed in any other fluid filled space, whether pressurised or not.

The invention claimed is:

1. A piezoelectric actuator arrangement for use in a fuel injector, the actuator arrangement comprising:
    a stack of one or more piezoelectric elements for receipt within a fluid chamber of the injector;
    an electrode arrangement for generating an electric field within the stack; and
    an electrical connector arrangement receivable within the fluid chamber and serving to electrically connect the electrode arrangement to an external power supply, in use, wherein the electrical connector arrangement comprises a first portion and a second portion, the first portion including a base member having an upper face defining a convex surface and the second portion including a body member having a lower face defining a concave surface, the concave surface of the body member cooperating with the convex surface of the base member thereby forming an articulated joint so as to provide the first portion with at least one degree of freedom relative to the second portion.

2. The actuator arrangement of claim 1, wherein the first portion and the second portion are aligned on a common axis.

3. The actuator arrangement of claim 1, wherein a friction-reducing coating is applied to the lower face of the body member and the upper face of the base member.

4. The actuator arrangement of claim 1, wherein the electrical connector arrangement includes a terminal arrangement comprising at least one conductor rod received through a respective bore disposed within the first portion and the second portion.

5. The actuator arrangement of claim 4, wherein the terminal arrangement further comprises a terminal blade associated with the or each conductor rod, respectively, for electrically connecting the or each conductor rod to the external power supply.

6. The actuator arrangement of claim 4, wherein the terminal arrangement further comprises an electrical contact plate associated with the or each conductor rod for electrically connecting the or each conductor rod to the electrode arrangement, in use.

7. The actuator arrangement claim 1, wherein the electrical connector arrangement includes a sealing surface for abutment with an internal surface defined by the fluid chamber when the actuator arrangement is received within the fluid chamber, in use.

8. The actuator arrangement of claim 7, wherein the sealing surface is defined by a shoulder region provided on the second portion.

9. The actuator arrangement of claim 8, wherein the shoulder region defines a knife-edge seal.

10. The actuator arrangement of claim 1, wherein the electrical connector arrangement includes a stem region carrying a sleeve member to define a press fit with a channel portion of the fluid chamber.

11. A fuel injector comprising a fluid chamber housing a piezoelectric actuator arrangement as claimed in claim 1.

12. The fuel injector of claim 11, wherein the fluid chamber defines a channel receiving a stem region of the actuator arrangement and wherein a drainage bore opens onto a wall of the channel.

* * * * *